(12) United States Patent
Tanida et al.

(10) Patent No.: US 7,456,502 B2
(45) Date of Patent: Nov. 25, 2008

(54) WIRING BOARD WITH CONNECTION ELECTRODE FORMED IN OPENING AND SEMICONDUCTOR DEVICE USING THE SAME

(75) Inventors: Kazumasa Tanida, Chiba (JP); Osamu Miyata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 78 days.

(21) Appl. No.: 10/593,393

(22) PCT Filed: Aug. 4, 2005

(86) PCT No.: PCT/JP2005/014294

§ 371 (c)(1),
(2), (4) Date: Sep. 19, 2006

(87) PCT Pub. No.: WO2006/035548

PCT Pub. Date: Apr. 6, 2006

(65) Prior Publication Data

US 2007/0200249 A1 Aug. 30, 2007

(30) Foreign Application Priority Data

Sep. 29, 2004 (JP) ............................. 2004-284681

(51) Int. Cl.
*H01L 23/48* (2006.01)

(52) U.S. Cl. .............. 257/778; 257/E23.021; 257/E23.068; 257/E21.512; 257/734; 257/737; 257/738; 257/682; 257/780; 257/782; 257/746

(58) Field of Classification Search ............. 257/778, 257/E23.021, 734, 737, 738, 692, 693, 780, 257/782, 746, E23.068, E21.512
See application file for complete search history.

(56) References Cited

U.S. PATENT DOCUMENTS

| 6,774,490 B2 * | 8/2004 | Soga et al. ............... 257/772 |
| 2002/0121709 A1 * | 9/2002 | Matsuki et al. ............ 257/786 |
| 2003/0151141 A1 * | 8/2003 | Matsuki et al. ............ 257/746 |
| 2004/0169286 A1 * | 9/2004 | Shibata ...................... 257/777 |

FOREIGN PATENT DOCUMENTS

| JP | 49-033564 | 3/1974 |
| JP | 9-082759 | 3/1997 |

OTHER PUBLICATIONS

Chua Khoon Lam et al., "Assembly and Reliability Performance of Flip Chip with No-flow Underfills", 2003 Electronics Packaging Technology Conference, pp. 336-341.

* cited by examiner

*Primary Examiner*—Alexander O Williams
(74) *Attorney, Agent, or Firm*—Rabin & Berdo, PC

(57) ABSTRACT

The invention provides a wiring board (2,15) to which a semiconductor chip (3) is to be bonded while directing a surface of the semiconductor chip toward the wiring board. The wiring board includes a connection electrode (14) that is formed on a bonding surface (2a, 15a) to which the semiconductor chip is to be bonded and that is used to make a connection with the semiconductor chip, an insulating film (6) that is formed on the bonding surface and that has an opening (6a) to expose the connection electrode, and a low-melting-point metallic part (16) that is provided on the connection electrode in the opening and that is made of a low-melting-point metallic material whose solidus temperature is lower than that of the connection electrode.

2 Claims, 4 Drawing Sheets ically held while directing the bonding surface 52a thereof upward. The

WIRING BOARD WITH CONNECTION ELECTRODE FORMED IN OPENING AND SEMICONDUCTOR DEVICE USING THE SAME

BACKGROUND OF THE INVENTION

1. Field of the Invention

This invention relates to a wiring board to which a semiconductor chip is connected in a flip chip manner, and relates to a semiconductor device in which a semiconductor chip is connected to this wiring board in a flip chip manner.

2. Description of Related Art

To realize a size reduction and high-density packaging of a semiconductor device, attention has been paid to a flip chip connection structure in which a semiconductor chip is connected to a solid state device while causing a functional surface of the semiconductor chip on which a functional element is formed to face the solid state device.

FIG. 6 is a diagrammatic sectional view of a semiconductor device that has a flip chip connection structure. This semiconductor device 51 includes a wiring board 52 and a semiconductor chip 53 connected to the wiring board 52 while causing a functional surface 53a on which a functional element 54 is formed to face a bonding surface 52a of the wiring board 52.

A plurality of connection electrodes 55 are formed on the bonding surface 52a of the wiring board 52. A solder resist film 56 that has a thickness smaller than a distance between the bonding surface 52a and the functional surface 53a of the semiconductor chip 53 is formed on the bonding surface 52a of the wiring board 52. The solder resist film 56 has a plurality of openings 56a by which each of the connection electrodes 55 is exposed.

A plurality of electrode pads 57 electrically connected to the functional element 54 are formed on the functional surface 53a of the semiconductor chip 53. The electrode pad 57 is exposed from an opening 59a formed in a surface protecting film 59 with which the functional surface 53a is covered. A projection electrode 58 protruding from the surface of the surface protecting film 59 is formed on each of the electrode pads 57.

The connection electrode 55 formed on the bonding surface 52a of the wiring board 52 and the projection electrode 58 formed on the functional surface 53a of the semiconductor chip 53 are connected together via a bonding material 60 made of a low-melting-point metal that is lower in solidus temperature (melting point) than the electrode pad 57, the connection electrode 55, and the projection electrode 58. A solder ball disposed on the projection electrode 58 of the semiconductor chip 53 is melted when the semiconductor chip 53 and the wiring board 52 are bonded together, and, as a result, the bonding material 60 is formed.

A gap existing between the wiring board 52 and the semiconductor chip 53 is filled with an underfill layer 63.

FIG. 7 is a diagrammatic sectional view for explaining a method for producing the conventional semiconductor device 51.

First, the wiring board 52 is substantially horizontally held while directing the bonding surface 52a thereof upward. The semiconductor chip 53 is then held while a rear surface 53b opposite the functional surface 53a is being adsorbed by a bonding tool 62 that has a built-in heater for heating. The semiconductor chip 53 is caused to face the bonding surface 52a of the wiring board 52 while directing the functional surface 53a downward. Solder balls 61 corresponding to the connection electrodes 55, respectively, are formed on the functional surface 53a of the semiconductor chip 53.

Thereafter, a positional adjustment is performed so that the solder ball 61 of the semiconductor chip 53 can come into contact with the connection electrode 55 of the wiring board 52, whereafter the bonding tool 62 is moved down so that the semiconductor chip 53 is bonded to the wiring board 52. At this time, the semiconductor chip 53 is heated by the bonding tool 62, and this heat melts the solder ball 61. Thereafter, the bonding tool 62 stops heating the semiconductor chip 53, so that the solder balls 61 are formed into the bonding material 60 by which the connection electrode 55 and the projection electrode 58 are electrically connected together.

Further, an unhardened (liquid) underfill material is injected into a gap between the wiring board 52 and the semiconductor chip 53, and a hardening process is performed, so that the gap between the wiring board 52 and the semiconductor chip 53 is filled with the underfill layer 63. As a result, the semiconductor device 51 shown in FIG. 6 is obtained.

This semiconductor device and producing method are disclosed by the following document.

Chua Khoon Lam, and another, "Assembly and Reliability Performance of Flip Chip with No-flow Underfills", 2003 Electronics Packaging Technology Conference, pp. 336-341.

However, the connection electrodes 55 of the wiring board 52 or the solder balls 61 of the semiconductor chip 53 are not equal in height, and therefore, in order to reliably bond the connection electrode 55 and the projection electrode 58 together, a large load must be applied onto the semiconductor chip 53 when bonded together. Therefore, the melted solder ball 61 spreads in a direction along the bonding surface 52a (the functional surface 53a). As a result, disadvantageously, the connection electrodes 55 adjoining in the in-plane direction of the bonding surface 52a (the projection electrodes 58 adjoining in the in-plane direction of the functional surface 53a) are electrically short-circuited by the bonding material 60, and a short circuit defect occurs.

Occasionally, the underfill layer 63 is formed such that an underfill material, which is unhardened, is applied onto the bonding surface 52a before bonding the semiconductor chip 53 to the wiring board 52, and is hardened after the semiconductor chip 53 is connected to the wiring board 52. In this case, in order to bring the solder ball 61 into contact with the connection electrode 55, the semiconductor chip 53 is pressed against the wiring board 52 by the bonding tool 62 with a greater force than a case in which an unhardened underfill material is absent.

If the semiconductor chip 53 is heated by the bonding tool 62 in this state and, as a result, a molten liquid of the solder ball 61 is generated, this molten liquid will easily spread in the in-plane direction of the bonding surface 52a. Hence, the connection electrodes 55 or the projection electrodes 58 adjoining in the in-plane direction are electrically short-circuited by the bonding material 60 formed by the solidifying of the molten liquid, and a short circuit defect is liable to occur.

SUMMARY OF THE INVENTION

It is an object of the present invention to provide a wiring board capable of preventing a short circuit between connection electrodes used to make an electric connection with a semiconductor chip, and provide a semiconductor device using this wiring board.

The wiring board according to the present invention is a wiring board to which a semiconductor chip is to be bonded while directing a surface of the semiconductor chip toward the wiring board. The wiring board includes a connection electrode that is formed on a bonding surface to which the semiconductor chip is to be bonded and that is for a connection with the semiconductor chip, an insulating film that is formed on the bonding surface and that has an opening to expose the connection electrode, and a low-melting-point metallic part that is provided on the connection electrode in the opening and that is made of a low-melting-point metallic material whose solidus temperature is lower than that of the connection electrode.

According to this invention, in the bonding surface which is to be bonded to the semiconductor chip, the opening to expose the connection electrode is formed in the insulating film provided on the uppermost surface of the wiring board, and the low-melting-point metallic part is disposed in the opening. Therefore, when connected to the semiconductor chip, a molten liquid of the low-melting-point metallic part can be generated by heating the wiring board at a higher temperature than the solidus temperature of the low-melting-point metallic part. The connection electrode of the wiring board and the semiconductor chip can be electrically connected together via a bonding material formed by solidifying this molten liquid.

At this time, even if a molten liquid is generated, the molten liquid of the low-melting-point metallic part can be left in the opening, and can be prevented from overflowing from the opening. Therefore, the connection electrodes adjoining in the in-plane direction of the bonding surface 15a can be prevented from being short-circuited by the melting low-melting-point metallic part.

Preferably, when the semiconductor chip is bonded to the wiring board, the wiring board is held while directing the bonding surface upward. In this case, even if the low-melting-point metallic part is heated at a higher temperature than the solidus temperature so as to generate a molten liquid, the molten liquid will flow downward because of the action of gravity when bonded. Therefore, the molten liquid is contained in the opening of the insulating film.

The insulating film may be a solder resist, for example.

A volume of an inside of the opening may be made greater than a sum of a volume of the connection electrode and a volume of the low-melting-point metallic part.

According to this arrangement, in the opening, the volume of the remainder of a space occupied by the connection electrode is greater than the volume of the low-melting-point metallic part. Since the volume of the low-melting-point metallic part is equal to the volume of the bonding material obtained by the melting and solidifying of the low-melting-point metallic part, the volume of the opening is large enough to contain all of the bonding material. Therefore, the low-melting-point metallic part and the molten liquid thereof are contained in the opening when bonded, and do not move to the connection electrodes or the projection electrodes adjoining in the in-plane direction of the bonding surface. Therefore, the wiring board can be prevented from causing a short circuit defect when bonded to the semiconductor chip.

Herein, let it be supposed that the volume of the low-melting-point metallic part includes not only the volume in a solid phase state but also the volume in a liquid phase state.

The low-melting-point metallic part can be formed on the connection electrode, for example, by plating. In this case, the volume of the low-melting-point metallic part can be set at a predetermined volume by controlling a plating thickness while controlling a plating time or a plating current.

Alternatively, the low-melting-point metallic part may be formed by applying a solder paste (cream solder) onto the connection electrode, then dispersing organic substances (flux, solvent, etc.) in the solder paste while heating the wiring board, and melting and solidifying a solder powder in the solder paste. In this case, the volume of the low-melting-point metallic part can be set at a predetermined volume by quantitatively controlling the solder paste to be applied. That is, the volume of the low-melting-point metallic part in this case denotes not the volume of the solder paste but the volume of the solder material obtained by allowing the solder powder that is a constituent element of the solder paste to be melted and solidified.

The semiconductor device according to the present invention includes a wiring board and a semiconductor chip that has a projection electrode formed on a surface on which a functional element is formed, the projection electrode being electrically connected to a functional element, the semiconductor chip being bonded to a bonding surface of the wiring board with the surface of the semiconductor chip facing the bonding surface. The wiring board includes a connection electrode that is formed on the bonding surface and that is used to make a connection with the semiconductor chip, an insulating film that is formed on the bonding surface and that has an opening to expose the connection electrode, and a low-melting-point metallic part that is provided on the connection electrode in the opening and that is made of a low-melting-point metallic material whose solidus temperature is lower than that of the connection electrode.

The volume of the inside of the opening may be made greater than the sum of the volume of the connection electrode and the volume of the low-melting-point metallic part.

The aforementioned object, other objects, features, and advantageous effects of the present invention will become apparent from the following description of an embodiment given with reference to the accompanying drawings.

DESCRIPTION OF THE PREFERRED EMBODIMENTS

Figure 1:
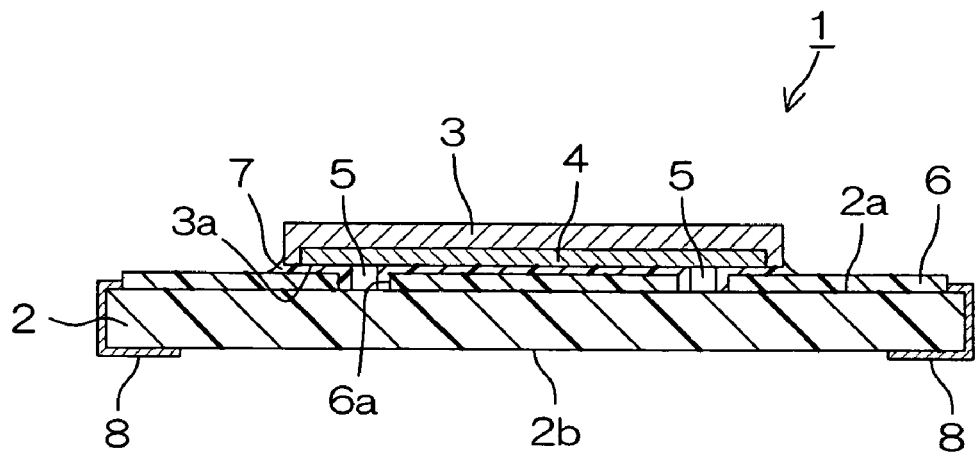
FIG. 1 is a diagrammatic sectional view showing a structure of a semiconductor device according to an embodiment of the present invention.

FIG. 1 is a diagrammatic sectional view of a semiconductor device according to an embodiment of the present invention. This semiconductor device 1 includes a wiring board 2 and a semiconductor chip 3 connected to the wiring board 2 with a functional surface 3a thereof on which a functional element 4 is formed facing a surface (hereinafter, referred to as "bonding surface") 2a of the wiring board 2.

A plurality of connection electrodes 14 (see FIG. 2 to FIG. 4) are formed on the bonding surface 2a of the wiring board 2. The wiring board 2 and the semiconductor chip 3 are bonded and electrically connected together, with a predetermined distance therebetween, through a plurality of connecting members 5 that include the connection electrodes 14, respectively.

A solder resist film 6 that has a thickness smaller than the distance between the bonding surface 2a and the semiconductor chip 3 is formed on the bonding surface 2a of the wiring board 2. The solder resist film 6 serves to prevent an electric short circuit between wires formed on the bonding surface 2a of the wiring board 2. A plurality of openings 6a by which the connection electrodes 14 are respectively exposed are formed in the solder resist film 6. The connecting member 5 is connected to the connection electrode 14 in the opening 6a.

An underfill layer 7 is disposed in a gap between the wiring board 2 and the semiconductor chip 3 (i.e., in an area that lies between the wiring board 2 and the semiconductor chip 3 and that overlaps with the semiconductor chip 3 when the bonding surface 2a is vertically viewed from above like a plan view). The gap between the wiring board 2 and the semiconductor chip 3 is sealed with the underfill layer 7, and the functional surface 3a and the connecting member 5 are protected with the underfill layer 7.

An end electrode 8 electrically connected to the connecting member 5 through a wire (not shown) is formed at an end of the wiring board 2. The end electrode 8 ranges from the bonding surface 2a of the wiring board 2 through the end face to an external connection surface 2b opposite the bonding surface 2a. In the end electrode 8, the semiconductor device 1 can establish an electric connection with another wiring board (mounting board).

Figure 2:
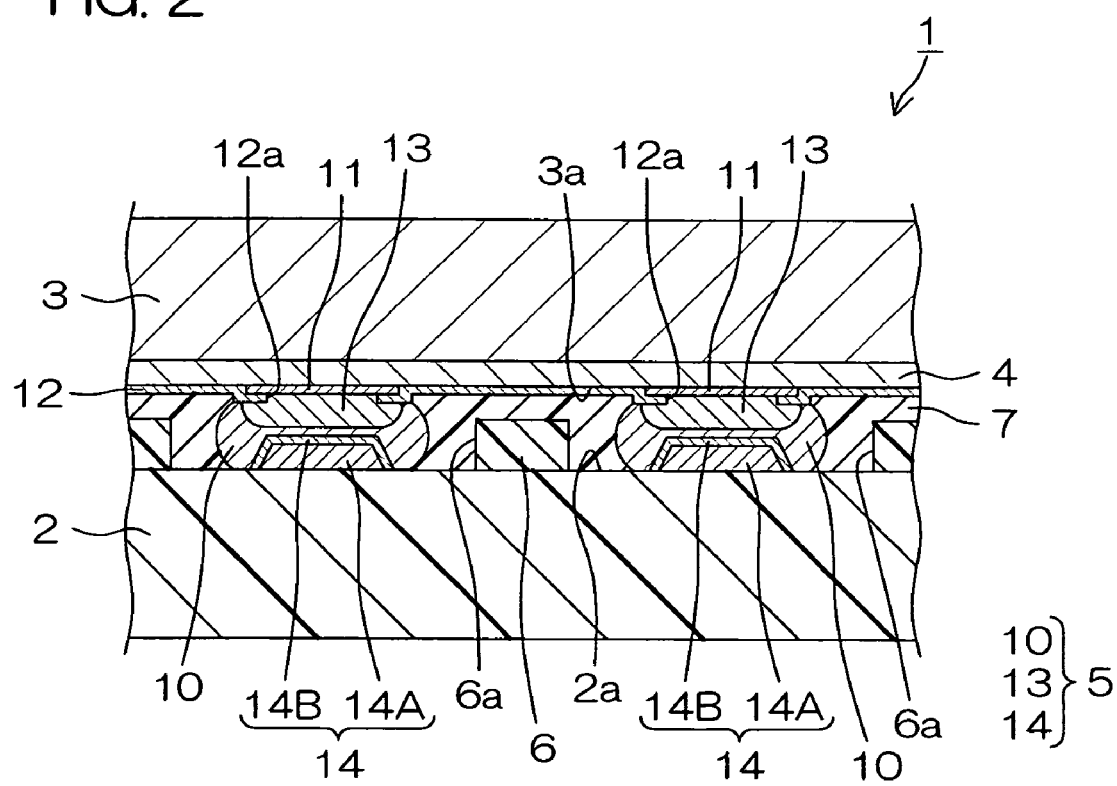
FIG. 2 is a diagrammatic, enlarged sectional view showing the periphery of connecting members of the semiconductor device shown in FIG. 1.

FIG. 2 is a diagrammatic, enlarged sectional view showing the periphery of the connecting members 5 of the semiconductor device 1.

A plurality of electrode pads 11 that are electrically connected to the functional element 4 and that are made of aluminum (Al) are formed on the functional surface 3a of the semiconductor chip 3. The electrode pad 11 is exposed from an opening 12a formed in a surface protecting film 12 with which the functional surface 3a is covered. The surface protecting film 12 is made of, for example, silicon nitride (passivation film) or polyimide. A projection electrode 13 protruding from the surface protecting film 12 is formed on each of the electrode pads 11. For example, the projection electrode 13 may be made by electroless nickel (Ni) plating and electroless gold (Au) plating, or may be made by electrolytic copper (Cu) plating and electrolytic gold plating.

Each of the connection electrodes 14 formed on the bonding surface 2a is formed at a position corresponding to each of the electrode pads 11 (the projection electrodes 13) formed on the functional surface 3a of the semiconductor chip 3. For example, the connection electrode 14 has a structure in which the surface of a copper pad 14A is covered with a nickel/gold-plated layer 14B.

The projection electrode 13 and the corresponding connection electrode 14 are mechanically bonded and electrically connected together with a bonding material 10. The bonding material 10 is a low-melting metal, such as tin (Sn), indium (In), or an alloy of these elements, that is lower in solidus temperature than the electrode pad 11, the projection electrode 13, and the connection electrode 14.

The connection electrode 14, the projection electrode 13, and the bonding material 10 constitute the connecting member 5.

Figure 3:
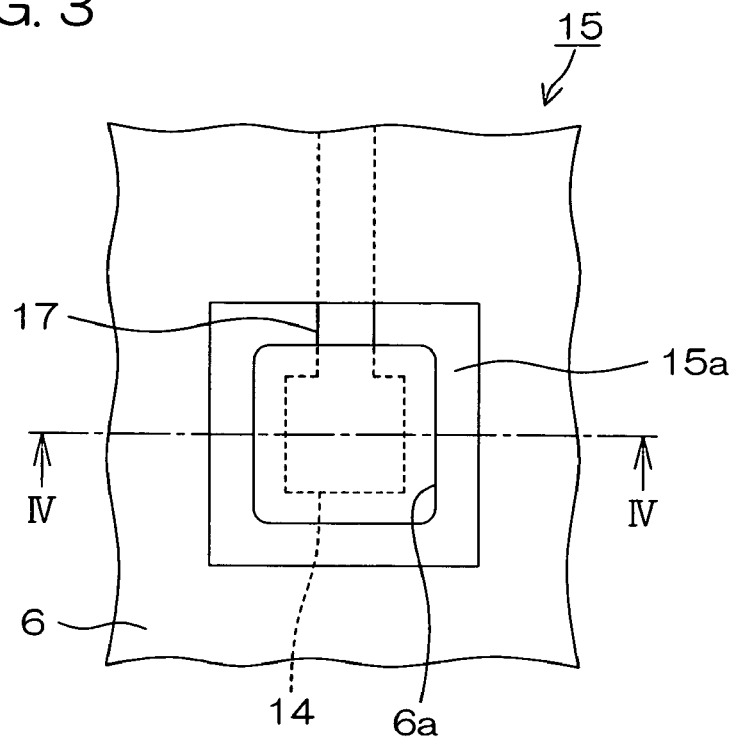
FIG. 3 and FIG. 4 are diagrammatic plan views for explaining a method for producing the semiconductor device shown in FIG. 1.
Figure 4:
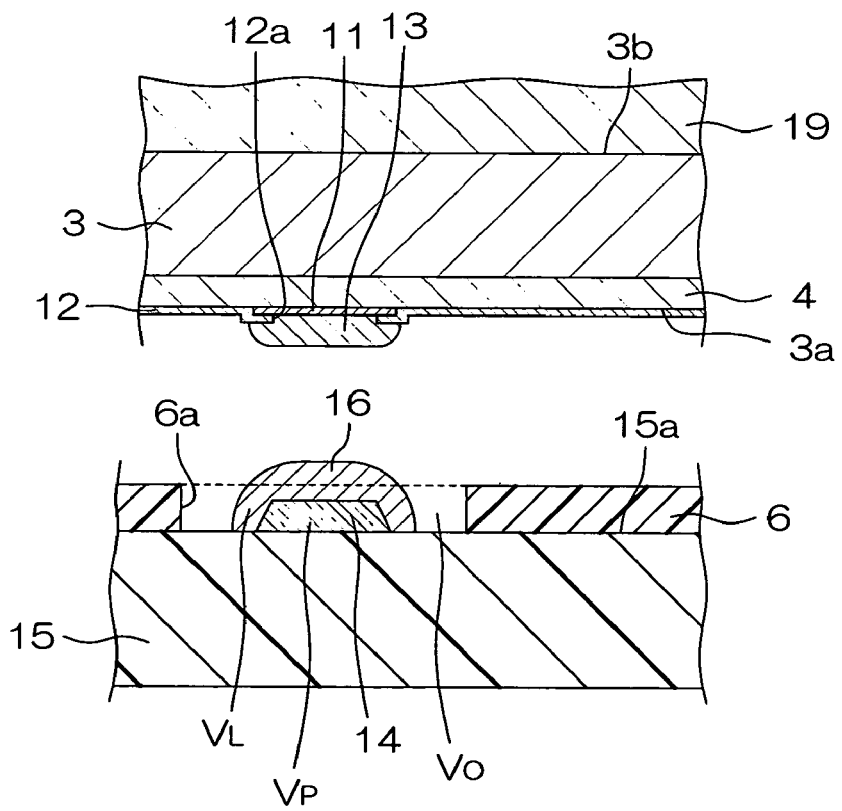

FIG. 3 is a diagrammatic plan view for explaining a method for producing the semiconductor device 1, and FIG. 4 is a diagrammatic sectional view along line IV-IV of FIG. 3. The semiconductor chip 3 is omitted in FIG. 3.

For example, the semiconductor device 1 can be obtained such that the semiconductor chip 3 is bonded to the bonding surface 2a of the wiring board 2 while directing the functional surface 3a of the semiconductor chip 3 toward the bonding surface 2a, whereafter a liquid underfill material is injected into a gap between the wiring board 2 and the semiconductor chip 3, whereafter the underfill material is hardened so as to form the underfill layer 7.

Figure 7:
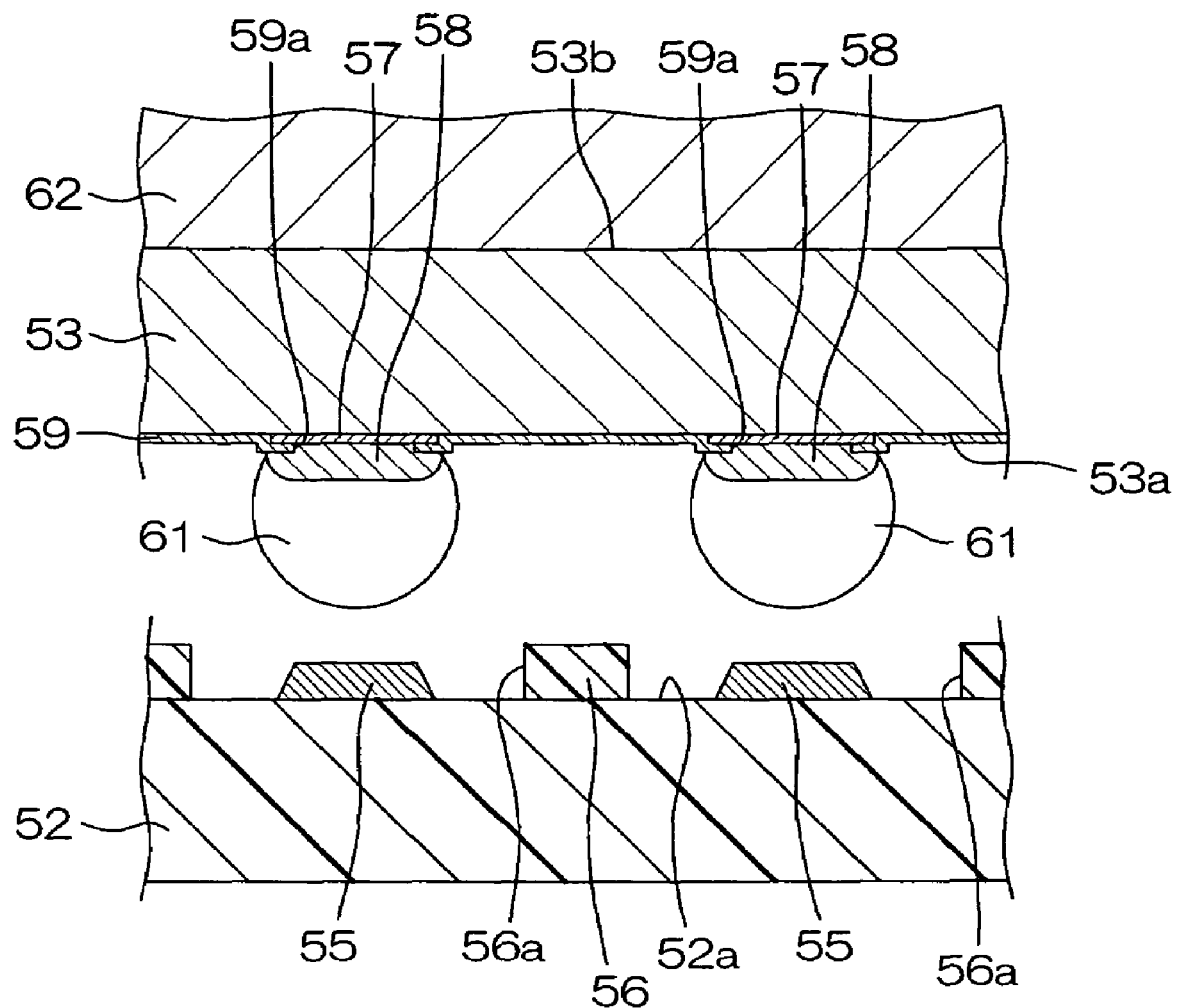
FIG. 7 is a diagrammatic sectional view for explaining a method for producing the semiconductor device shown in FIG. 6.

In more detail, the semiconductor chip 3 in which the electrode pad 11, the surface protecting film 12, and the projection electrode 13 are formed on the functional surface 3a is first prepared. As shown in FIG. 4, a member corresponding to the solder ball 61 (see FIG. 7) in the conventional method for producing the semiconductor device 51 is not provided on the side of the functional surface 3a of the semiconductor chip 3, and the projection electrode 13 has its surface exposed from the surface protecting film 12, and juts therefrom.

Thereafter, a substrate 15 in which a plurality of wiring boards 2 are formed is prepared. A low-melting metal film 16 is formed on a bonding surface 15a of the substrate 15 (a bonding surface 2a of the wiring board 2) in such a way as to cover each of the connection electrodes 14 therewith.

The low-melting metal film 16 is made of a metallic material having almost the same composition as the bonding material 10 of the semiconductor device 1. That is, the solidus temperature of the low-melting metal film 16 is lower than that of each of the electrode pads 11, the projection electrodes 13, and the connection electrodes 14 (the copper pad 14A and the nickel/gold-plated layer 14B).

The low-melting metal film 16 can be formed on the connection electrode 14, for example, by plating. Alternatively, the low-melting metal film 16 can be formed such that a solder paste (cream solder) is applied onto the connection electrode 14, and organic substances (flux, solvent, etc.) in the solder paste are then dispersed while heating the substrate 15, and a solder powder in the solder paste is melted and solidified.

For example, the connection electrode 14 and the opening 6a are each shaped substantially like a square, and the connection electrode 14 is disposed at almost the center of the opening 6a when the bonding surface 15a is vertically viewed from above like a plan view (see FIG. 3). The connection electrode 14 and the opening 6a may be shaped like a polygon other than a square or a circle, when the bonding surface 15a is vertically viewed from above like a plan view. A wire 17 connected to the end electrode 8 (see FIG. 1) is extended from the connection electrode 14. The wire 17 is covered with the solder resist film 6, excluding the connection electrode 14 and the vicinity of a connection part of the wire 17 to the connection electrode 14.

For example, the low-melting metal film 16 is shaped substantially like a square, and lies in a formation area of the opening 6a when the bonding surface 15a is vertically viewed from above like a plan view. The low-melting metal film 16 may be shaped like a polygon other than a square or a circle, when the bonding surface 15a is vertically viewed from above like a plan view.

Each opening 6a is formed so that the volume $V_O$ thereof is greater than the sum of the volume $V_P$ of the connection electrode 14 disposed in the opening 6a and the volume $V_L$ of the low-melting metal film 16 (see the following formula (1)).

$$V_O > V_L + V_P \qquad (1)$$

If the volume of the low-melting metal film 16 in a state including a molten liquid (liquid phase) is greater than the volume of the low-melting metal film 16 in a solid phase state, the volume $V_L$ of the low-melting metal film 16 in formula (1) is the volume of the low-melting metal film 16 in the state including the liquid phase.

When the low-melting metal film 16 is formed by plating, the volume $V_L$ of the low-melting metal film 16 can be set at a predetermined volume by controlling a plating thickness according to a plating current (in electrolytic plating) or a plating time.

When the low-melting metal film 16 is formed by using a solder paste, the volume $V_L$ of the low-melting metal film 16 can be set at a predetermined volume by quantitatively controlling the solder paste to be applied. The volume $V_L$ of the low-melting metal film 16 in this case denotes not the volume of the solder paste but the volume of the low-melting metal film 16 from which organic substances have been removed and which can be obtained by melting and solidifying a solder powder that is a constituent element of the solder paste.

If the opening 6a can be regarded as being shaped like a pillar (in this embodiment, a square pillar), the volume $V_O$ of the opening 6a is equal to the product of the thickness of the solder resist film 6 and the area of the opening 6a when the solder resist film 6 is vertically viewed from above like a plan view.

Thereafter, the substrate 15 is almost horizontally held while directing the bonding surface 15a upward. The semiconductor chip 3 is then held by a bonding tool 19 that has a built-in heater for heating while a rear surface 3b opposite the functional surface 3a of the semiconductor chip 3 is being absorbed. The semiconductor chip 3 is caused to face the bonding surface 15a of the substrate 15 while directing the functional surface 3a downward. FIG. 4 shows this state.

Thereafter, the projection electrode 13 of the semiconductor chip 3 and the low-melting metal film 16 of the substrate 15 are positionally adjusted, whereafter the bonding tool 19 is moved down so that the projection electrode 13 comes into contact with the low-melting metal film 16. Herein, there is a case in which the low-melting metal films 16 formed on the connection electrodes 14 of the substrate 15 or the projection electrodes 13 of the semiconductor chip 3 have a great fluctuation in height. If so, a large load is applied onto the semiconductor chip 3 by the bonding tool 19, in order to infallibly connect the low-melting metal film 16 and the projection electrode 13 together.

The semiconductor chip 3 is heated by the bonding tool 19 in this state. The low-melting metal film 16 is heated to be greater than the solidus temperature thereof (preferably, greater than the liquidus temperature thereof), and is melted with this heat. Thereafter, the bonding tool 19 stops heating the semiconductor chip 3, whereafter the projection electrode 13 and the connection electrode 14 are electrically connected and mechanically bonded together by the bonding material 10 formed by solidifying the molten liquid of the low-melting metal film 16.

Herein, since the sum of the volume $V_P$ of the connection electrode 14 and the volume $V_L$ of the low-melting metal film 16 is smaller than the volume $V_O$ of the opening 6a, the low-melting metal film 16 and/or the molten liquid thereof is contained in the remaining space of the connection electrode 14 in the opening 6a. Additionally, since the low-melting metal film 16 is formed not on the projection electrode 13 but on the connection electrode 14 disposed in the opening 6a, the low-melting metal film 16 or the molten liquid thereof spreads outside the opening 6a, and never moves in the in-plane direction of the bonding surface 15a. As a result, the projection electrodes 13 and the connection electrodes 14 adjoining in this in-plane direction can be prevented from being electrically short-circuited by the bonding material 10 and causing a short circuit defect, even if a large load is applied onto the semiconductor chip 3.

Thereafter, an underfill layer 7 (see FIG. 1 and FIG. 2) is formed to fill a gap between the substrate 15 and the semiconductor chip 3. The underfill layer 7 is formed such that, for example, an unhardened (liquid) underfill material is discharged from a dispenser, is then injected into a gap between the substrate 15 and the semiconductor chip 3 according to capillarity, and is hardened (for example, thermally hardened).

The unhardened underfill material may be applied to the side of the bonding surface 15a of the substrate 15 to which the semiconductor chip 3 has not yet been connected. In this case, the semiconductor chip 3 is pressed against the substrate 15 by the bonding tool 19, whereby the low-melting metal film 16 and the projection electrode 13 pierce through the unhardened underfill material and come into contact with each other. After the semiconductor chip 3 is completely bonded to the substrate 15, the unhardened underfill material is hardened. As a result, the underfill layer 7 is obtained.

In this case, in order to bring the projection electrode 13 into contact with the low-melting metal film 16 when the semiconductor chip 3 is bonded to the substrate 15, the semiconductor chip 3 is pressed against the substrate 15 by the bonding tool 19 with a greater force than a case in which an unhardened underfill material is absent. The molten liquid of the low-melting metal film 16 is contained in the remaining space of the connection electrode 14 in the opening 6a even if the semiconductor chip 3 is heated by the bonding tool 19 in this state so as to melt the low-melting metal film 16. Therefore, the connection electrodes 14 and the projection electrodes 13 adjoining in the in-plane direction of the bonding surface 15a are prevented from being short-circuited by the bonding material 10.

Thereafter, the substrate 15 is cut into wiring boards 2, and the end electrode 8 is formed on the end of each of the wiring boards 2, thus obtaining the semiconductor device 1 shown in FIG. 1.

Although the embodiment of the present invention is described as above, the present invention can be embodied in other forms. For example, two or more semiconductor chips 3 may be connected to the wiring board 2 in a flip chip manner.

Figure 5:
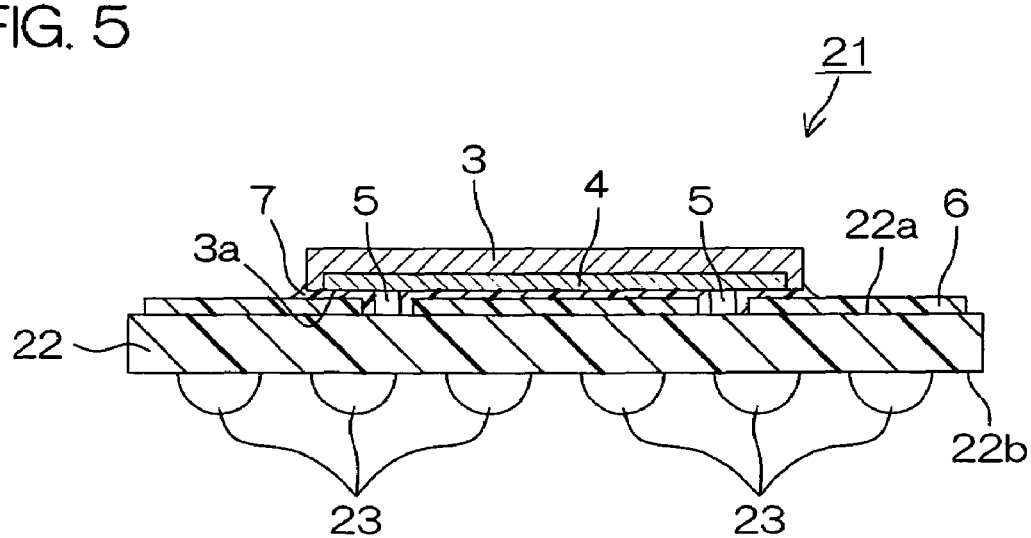
FIG. 5 is a diagrammatic sectional view showing a modification of the semiconductor device shown in FIG. 1.
Figure 6:
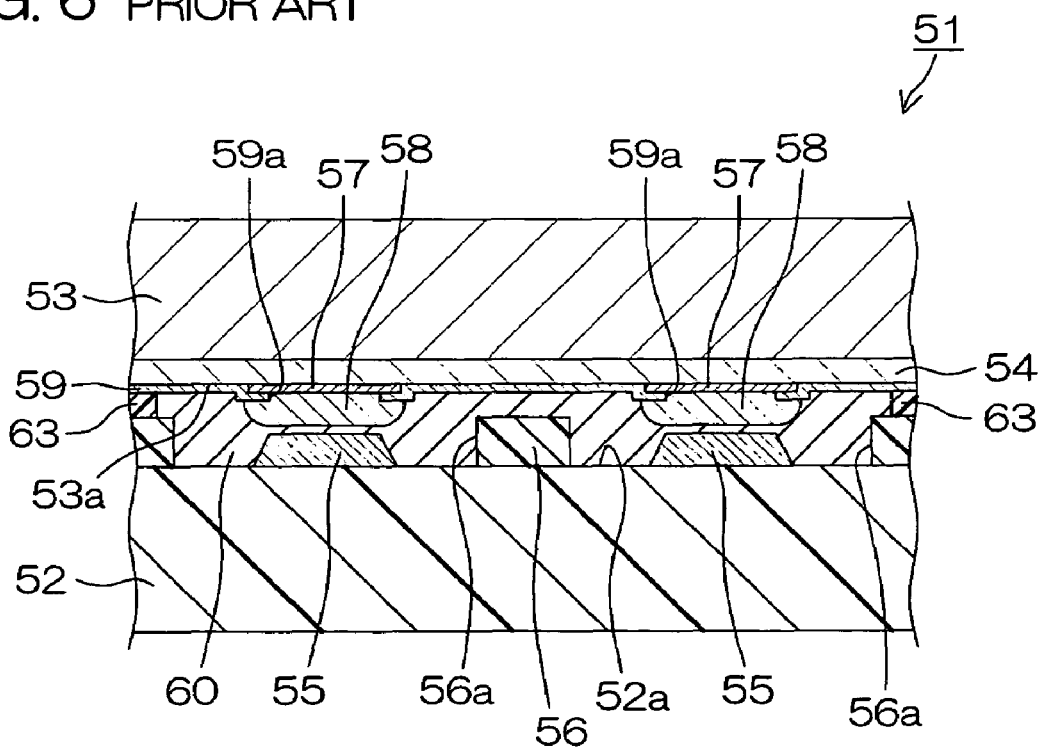
FIG. 6 is a diagrammatic sectional view showing a structure of a semiconductor device having a flip chip connection structure.

The packaging of the semiconductor device of the present invention may be carried out in other forms, without being limited to the semiconductor device 1 of the FIG. 1 in which the end electrode 8 is used as an external connection member. FIG. 5 is a diagrammatic sectional view showing a modification of the semiconductor device 1. In FIG. 5, the same reference character as in FIG. 1 is given to an element corresponding to each element shown in FIG. 1.

This semiconductor device 21 has metallic balls 23 used as external connection members, instead of the end electrode 8 of the semiconductor device 1, on an external connection surface 22b (i.e., a surface opposite a bonding surface 22a to which the semiconductor chip 3 is connected). The metallic balls 23 are re-wired inside the wiring board 22 and/or on the surface thereof, and are electrically connected to the connecting member 5. This semiconductor device 21 can be bonded to another wiring board via the metallic balls 23.

The embodiments of the present invention have been described as above. However, these are merely concrete examples used to clarify the technical contents of the present invention. The present invention should not be understood by being limited to these examples. The spirit and scope of the present invention are limited only by the scope of the appended claims.

This application is based on Japanese Patent Application No. 2004-284681, filed in the Japan Patent Office on Sep. 29, 2004, the entire contents of which are hereby incorporated by reference.

What is claimed is:

1. A wiring board to which a semiconductor chip is to be bonded while directing a surface of the semiconductor chip toward the wiring board, the wiring board comprising:
   a connection electrode formed on a bonding surface to which the semiconductor chip is to be bonded, the connection electrode being for a connection with the semiconductor chip;
   an insulating film formed on the bonding surface, the insulating film having an opening to expose the connection electrode; and
   a low-melting-point metallic part provided on the connection electrode in the opening, the low-melting-point metallic part being made of a low-melting-point metallic material whose solidus temperature is lower than that of the connection electrode, wherein a volume of an inside of the opening is greater than a sum of a volume of the connection electrode and a volume of the low-melting-point metallic part.

2. A semiconductor device comprising:
   a wiring board; and
   a semiconductor chip having a projection electrode formed on a surface on which a functional element is formed, the projection electrode being electrically connected to the functional element, the semiconductor chip being bonded to a bonding surface of the wiring board with the surface of the semiconductor chip facing the bonding surface;
   the wiring board including:
   a connection electrode formed on the bonding surface, the connection electrode being used to make a connection with the semiconductor chip;
   an insulating film formed on the bonding surface, the insulating film having an opening to expose the connection electrode; and
   a low-melting-point metallic part provided on the connection electrode in the opening, the low-melting-point metallic part being made of a low-melting-point metallic material whose solidus temperature is lower than that of the connection electrode, wherein a volume of an inside of the opening is greater than a sum of a volume of the connection electrode and a volume of the low-melting-point metallic part.

* * * * *